United States Patent [19]

Heinecke et al.

[11] 4,315,692
[45] Feb. 16, 1982

[54] MASK ALIGNMENT FOR SEMICONDUCTOR PROCESSING

[75] Inventors: Rudolf A. H. Heinecke, Harlow; David J. Moule, Saffron Walden, both of England

[73] Assignee: International Standard Electric Corporation, New York, N.Y.

[21] Appl. No.: 201,945

[22] Filed: Oct. 29, 1980

Related U.S. Application Data

[63] Continuation of Ser. No. 23,925, Mar. 26, 1979, abandoned.

[30] Foreign Application Priority Data

May 16, 1978 [GB] United Kingdom ............... 19779/78

[51] Int. Cl.³ .................. G01B 11/00; G03B 27/64
[52] U.S. Cl. ..................................... 356/399; 350/63; 350/81; 355/76
[58] Field of Search ........................ 356/399, 400–401, 356/138, 153; 350/63, 81, 90; 355/76, 73, 91–92, 132; 250/491, 429 A, 492 A; 269/21

[56] References Cited

U.S. PATENT DOCUMENTS

| | | | |
|---|---|---|---|
| 3,310,356 | 3/1967 | Borberg | 350/63 |
| 3,321,265 | 5/1967 | Clave et al. | 350/63 |
| 3,538,754 | 11/1970 | Grolman et al. | 350/63 |
| 3,626,141 | 12/1971 | Daly | 350/63 |
| 3,955,163 | 5/1976 | Novak | 355/91 |
| 4,026,653 | 5/1977 | Appelbaum et al. | 355/76 |
| 4,122,335 | 10/1978 | Sullivan | 250/492 A |
| 4,270,838 | 6/1981 | Furusawa et al. | 350/81 |

FOREIGN PATENT DOCUMENTS

287387 1/1968 Australia ............................ 350/81
2307096 8/1974 Fed. Rep. of Germany ........ 269/21

OTHER PUBLICATIONS

Klein et al., "Mask Support & Clamp Structure", IBM Tech. Disc. Bull., 10-1970, pp. 1304–1305.

Primary Examiner—William H. Punter
Attorney, Agent, or Firm—John T. O'Halloran; Thomas N. Twomey

[57] ABSTRACT

A high power microscope is fitted with a gas jet arrangement for blowing a thin flexible mask into local contact with a semiconductor substrate so as to facilitate mask alignment.

3 Claims, 1 Drawing Figure

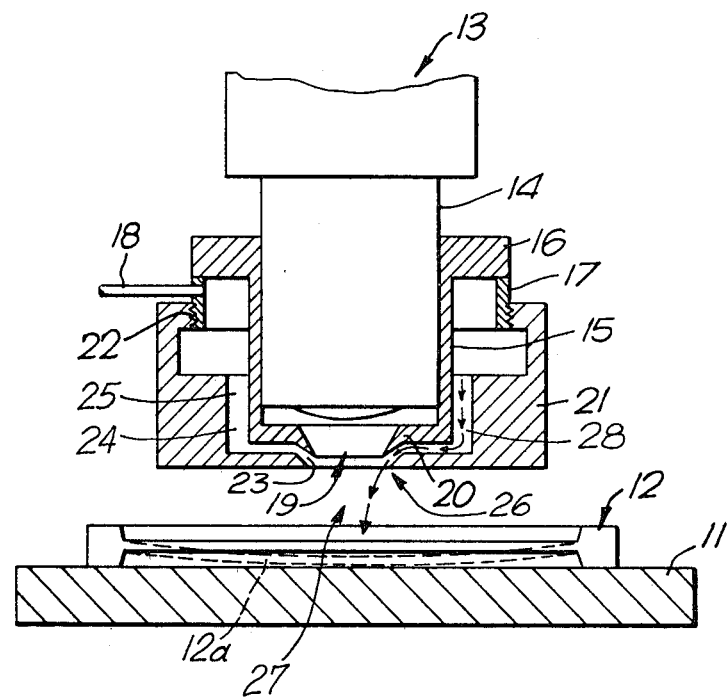

MASK ALIGNMENT FOR SEMICONDUCTOR PROCESSING

This is a continuation, of application Ser. No. 023,925, filed March 26, 1979, now abandoned.

BACKGROUND OF THE INVENTION

This invention relates to X-ray lithographic techniques such as are employed in the fabrication of semiconductor devices, and in particular to an apparatus for and a method of lithographic mask alignment.

There is a requirement in the semiconductor industry for techniques that meet the demand for more complex integrated circuits. One of the major problems involved in obtaining the very high definition required is that of mask alignment with the substrate. In general a microscope is employed to observe alignment between reference marks on the mask and substrate. If an 'in-contact' mask is employed there is a considerable risk of damage to both the substrate and the mask while the latter is being adjusted for correct alignment. If, however, an 'out-of-contact' mask is used alignment is difficult as the spring between the mask and the substrate is generally of the order of the depth of focus of a microscope and thus limits the power of the microscope to be used for alignment.

SUMMARY OF THE INVENTION

The object of the invention is to minimize or to overcome this disadvantage.

According to the invention there is provided an apparatus for facilitating alignment of a flexible mask with a semiconductor process wafer and adapted to be mounted on a cylindrical objective portion of a split field microscope, the apparatus including a tubular member of a diameter such that the member is a sliding fit on the objective portion, a cylindrical housing member mounted on the tubular member so as to define an annular cavity therebetween and means for supplying gas to said cavity, in which the housing member has an opening into which the tubular member protrudes so as to define an orifice, the orifice being concentric with the objective lens of the microscope when the apparatus is fitted thereto, and in which the orifice is so dimensioned as to direct radially inwardly a gas stream passed therethrough so as to produce a region of sufficient energy density to deform the mask into local contact with the substrate.

The locally high gas pressure bows that portion of the mask in register with the microscope objective into local contact with the substrate and into the focal range of the microscope. Movement of the mask is effected by temporarily shutting off the gas supply so that there is no sliding contact between the substrate and mask. It has been found in practice that it is a simple matter to adjust the gas flow to provide this 'just in contact' configuration of the mask. When alignment has been effected the microscope is removed and semiconductor processing techniques are used to form a circuit pattern on the substrate.

BRIEF DESCRIPTION OF THE DRAWING

An embodiment of the invention will now be described with reference to the accompanying drawing, which is a schematic cross section of a mask alignment apparatus.

DETAILED DESCRIPTION OF THE INVENTION

Referring to the drawing, there is shown a semiconductor process wafer 11 overlaid by a non-contact mask 12, the latter being advantageously of the thin silicon type described in United Kingdom patent application No. 10033/75. The alignment apparatus 13 is arranged above the mask 12 and comprises a split-field microscope on the objective lens housing 14 of which is slidably mounted a tubular member 15 provided with means (not shown) for locking the member 15 to the lens housing 14. The upper end of the member 15 has an outwardly directed flange 16 to which is fitted a ring member 17 having an entry tube 18 to which dust-free air or nitrogen is supplied. The lower end of the member 15 has an opening 19 in register with the objective lenses of the microscope and defined by a tapered annulus 20.

An outer cylindrical housing member 21 has an opening 25 of sufficient size to receive the member 15. The outer housing 21 is secured to the ring member 17 via a screw thread 22 forming an annular cavity 24 between members 15 and 21 which cavity terminates in a circular opening 26 concentric with the opening 19 of the member 15 so as to define an annular orifice 23 the size of which is adjustable via the screw thread. The orifice is dimensioned so as to direct radially inwardly a gas stream 28 passed therethrough so as to produce a region 27 of sufficient energy density to deform the mask into local contact with the substrate. The deformed mask is shown by dashed lines 12a.

In use, dust free gas is fed via the side tube 18 to the orifice 23 so as to blow the mask into soft local contact with the underlying semiconductor process wafer. In this way the mask can be checked for alignment with the wafer and, if necessary, can be moved without damaging the wafer simply by turning off the gas supply. The arrangement permits the use of high magnification objective lenses and minimizes the contact area between the mask and the process wafer during the alignment operation.

In some applications the objective lens may be so designed that, due to the Coanda effect, the gas flow follows part of the lens surface flowing radially inwardly thus ensuring a highly directional flow. In a further application the gas may flow through an orifice provided in the center of the objective lens.

While we have described above the principles of our invention in connection with specific apparatus it is to be clearly understood that this description is made only by way of example and not as a limitation to the scope of our invention as set forth in the objects thereof and in the accompanying claims.

What is claimed is:

1. An apparatus for facilitating alignment of a flexible mask with a semiconductor process wafer and adapted to be mounted on a cylindrical objective portion of a split field microscope, the apparatus comprising a tubular member of a diameter such that the member is a sliding fit on the objective portion, a cylindrical housing member mounted on the tubular member so as to define an annular cavity therebetween, and means for supplying gas to said cavity, in which the housing member has an opening into which the tubular member protrudes so as to define an orifice, the orifice being concentric with an objective lens of the microscope when the apparatus is fitted thereto, and in which the orifice is so dimensioned as to produce a gas stream creating a region of sufficient energy density to deform that portion of the mask disposed between the microscope objective and the process wafer into local soft contact with the semiconductor process wafer.

2. An apparatus as claimed in claim 1, in which said region of sufficient energy density is produced beneath the center of the objective lens.

3. An apparatus as claimed in claim 1, and in which the objective lens is so arranged that the gas flows radially inwardly following part of the lens surface.

* * * * *